(12) United States Patent
Sato

(10) Patent No.: US 8,193,561 B2
(45) Date of Patent: Jun. 5, 2012

(54) SEMICONDUCTOR DEVICE AND METHOD OF MANUFACTURING THE SAME

(75) Inventor: Ken Sato, Niiza (JP)

(73) Assignee: Sanken Electric Co., Ltd., Niiza-Shi (JP)

( * ) Notice: Subject to any disclaimer, the term of this patent is extended or adjusted under 35 U.S.C. 154(b) by 72 days.

(21) Appl. No.: 12/908,930

(22) Filed: Oct. 21, 2010

(65) Prior Publication Data

US 2011/0095337 A1 Apr. 28, 2011

(30) Foreign Application Priority Data

Oct. 22, 2009 (JP) ................................. 2009-243369

(51) Int. Cl.
*H01L 29/66* (2006.01)
(52) U.S. Cl. ................. 257/192; 257/E29.246
(58) Field of Classification Search .................. None
See application file for complete search history.

(56) References Cited

U.S. PATENT DOCUMENTS

| 7,671,383 B2 * | 3/2010 | Hayashi et al. ............... 257/192 |
| 2001/0040247 A1 | 11/2001 | Ando et al. | |
| 2002/2200240 * | 2/2002 | Inokuchi et al. ............. 257/155 |
| 2007/0051978 A1 | 3/2007 | Mita et al. | |

FOREIGN PATENT DOCUMENTS

| JP | 2001-274375 A | 10/2001 |
| JP | 2007-53185 A | 3/2007 |

* cited by examiner

*Primary Examiner* — Ha Tran T Nguyen
*Assistant Examiner* — Kevin Quinto
(74) *Attorney, Agent, or Firm* — Birch, Stewart, Kolasch & Birch, LLP

(57) ABSTRACT

A semiconductor device reduces the on-resistance and, at the same time, raises the breakdown voltage. The drain electrode 20 of the semiconductor device runs through cap layer 13 and electron supply layer 12 and gets to a position lower than two-dimensional electron gas layer 14 in channel layer 11. Thus, the drain electrode 20 directly contacts the channel layer 11, the electron supply layer 12 and the cap layer 13. Angles (acute angles) θ, ø and ψ are formed by the drain electrode 20 and the channel layer 11, the electron supply layer 12 and the cap layer 13 as viewed in the direction in which a hetero interface is formed (the transverse direction in FIG. 1) and relationships of ø<θ and ø≦ψ are established. In other words, ø is made smallest among the angles and the drain electrode 20 is remarkably tapered particularly at the position of the electron supply layer 12.

10 Claims, 3 Drawing Sheets

SEMICONDUCTOR DEVICE AND METHOD OF MANUFACTURING THE SAME

BACKGROUND OF THE INVENTION

1. Field of the Invention

This invention relates to a structure of semiconductor device that utilizes a conductive layer formed near a hetero-junction interface of a compound semiconductor and a method of manufacturing the same.

2. Description of the Related Art

High electron mobility transistors (HEMTs) using a compound semiconductor, GaN for example, are used as high power and high frequency devices. FIG. 5 schematically shows a cross-sectional view of a known HEMT device 90. Referring to FIG. 5, a channel layer 92, an electron supply layer 93 and a cap layer 94 are sequentially formed on a substrate 91 by epitaxial growth. For example, the channel layer 92 is formed by semi-insulating (non-doped) GaN, the electronic supply layer 93 is formed by semi-insulating (non-doped) AlGaN (to be more accurate, semi-insulating (non-doped) $Al_xGa_{1-x}N$, where x=around 0.20) and the cap layer 94 is formed by n-type GaN. In this structure, a two-dimensional electron gas layer 95 (indicated by a broken line in FIG. 5) that becomes an conductive layer is formed near and in parallel with the interface (hetero interface) between the channel layer 92 and the electron supply layer 93 at the side of the channel layer 92. An electron current flows between a source electrode 96 and a drain electrode 97 due to the two-dimensional electron gas layer 95 and on/off of the channel formed by two-dimensional electron gas is controlled for switching operations by the voltage applied to the gate electrode 98 that becomes to operate as Schottky electrode. High-speed switching operations are possible because the speed (mobility) of electrons in the two-dimensional electron gas is very high. Since GaN has a wide band gap compared to GaAs or the like, the HEMT device 90 shows a high breakdown voltage and is adapted to high output operations.

In order to make the on-resistance of the HEMT device 90 low, it is necessary to reduce the resistance between the two-dimensional electron gas layer 95 and the source electrode 96 and between the two-dimensional electron gas layer 95 and the drain electrode 97, the source electrode 96 and drain electrode 97 being held in ohmic contact with the two-dimensional electron gas layer 95. This purpose can be effectively achieved by filling the electrode materials of these electrodes 96 and 97 in the respective recess structures obtained by locally etching the cap layer 94, the electron supply layer 93 and the channel layer 92 at places for receiving the source electrode 96 and the drain electrode 97 so as to make the source electrode 96 and the drain electrode 92 directly contact the two-dimensional electron gas layer 95 as shown in FIG. 5.

A technique of reducing the on-resistance by devising the shape of the source electrode 96 and that of the drain electrode 97 (or the etched shape at their places) in a particular way is described in Patent Document 1.

The on-resistance can be reduced to provide a high performance HEMT device by etching the cap layer 94, the electron supply layer 93 and the channel layer 92, using the shape and the depths as described in Patent Document 1, to produce recess structures and filling the electrode materials in the recess structures to obtain the source electrode 96 and the drain electrode 97.

CITATION LIST

Patent Document

Patent Document 1 Jpn. Pat. Publication No. 2007-053185

However, in the case of a HEMT device using nitride semiconductor such as GaN, that is used as power device, it is important not only to reduce the on-resistance but also to raise the breakdown voltage. The technique described in Patent Document 1 is not intended at all to improve the breakdown voltage of a HEMT device.

Therefore, it has been different for a semiconductor device utilizing an conductive layer formed near a hetero-junction interface of a compound semiconductor to reduce the on-resistance and, at the same time, raise the breakdown voltage.

SUMMARY OF THE INVENTION

In view of the above-identified problem, it is therefore the invention to provide a semiconductor device and a method of manufacturing the same that can dissolve the problem.

In an aspect of the present invention, the above object is achieved by providing a semiconductor device comprising: a hetero structure formed by laying a first semiconductor layer within which a flow path of carriers is formed and a second semiconductor layer made of a material different from that of the first semiconductor layer and laid on the first semiconductor layer; and an electrode penetrating through the second semiconductor layer, held in contact with the flow path of carriers and tapered so as to make the cross-sectional area parallel to the hetero interface of the hetero structure larger at the side of the second semiconductor layer than at the side of the first semiconductor layer, the device showing relationships of $0°<ø≦60°$ and $ø≠θ$, where $θ$ is the acute angle formed by the tangent plane of the lateral surface of the electrode and the hetero interface at a position where the electrode contacts the flow path of charge carriers and $ø$ is the acute angle formed by the tangent plane of the lateral surface of the electrode and the hetero interface at a position where the electrode contacts the second semiconductor layer above the position where the electrode contacts the flow path of charge carriers on respective cross sections taken along the flow direction of charge carriers.

Preferably, in the semiconductor device according to the present invention, a cap layer made of a material with different composition or different element from the second semiconductor layer is formed on the second semiconductor layer and the electrode penetrates through the cap layer, the device showing a relationship of $ø≦ψ$, where $ψ$ is the acute angle formed by the tangent plane of the lateral surface of the electrode and the hetero interface at a position where the electrode contacts the cap layer above the position where the electrode contacts the flow path of carriers on a cross section taken along the flow direction of carriers.

Preferably, in the semiconductor device according to the present invention, a step is formed at the lateral surface of the electrode where the electrode contacts the cap layer and the second semiconductor layer so as to make the cross-sectional area of the electrode taken along the hetero interface greater at the side of the cap layer than at the side of the second semiconductor layer as viewed from the interface of the cap layer and the second semiconductor layer.

Preferably, in the semiconductor device according to the present invention, the first and second semiconductor layers respectively have compositions expressed by chemical formulas of $Al_xM_yGA_{1-x-y}N$ (where $0≦x<1$, $0≦y<1$, $0≦x+y<1$ and M contains at least In or B).

Preferably, in the semiconductor device according to the present invention, the flow path of carriers is formed two-dimensionally by carrier gas generated in the first semiconductor layer.

Preferably, the semiconductor device according to the present invention includes two electrodes so as to make carriers flow between the two electrodes and a gate electrode arranged on the flow path of carriers.

Preferably, the semiconductor device according to the present invention further includes another electrode that penetrates through the second semiconductor layer, contacts the flow path of carriers, and the flow path is made between the another electrode and the electrode, and a gate electrode formed on the flow path of carriers, the device showing a relationship of ø'>ø, where ø' is the angle formed by the tangent plane of the lateral surface of the another electrode and the hetero interface at a position where the another electrode contacts the second semiconductor layer.

The semiconductor device according to the present invention may show a relationship of ø<θ.

The semiconductor device according to the present invention may show a relationship of ø>θ.

In another aspect of the present invention, there is provided a method of manufacturing a semiconductor device as defined above including: an etching step of forming a recess structure corresponding to the shape of the electrode by locally dry etching the second semiconductor layer and also the first semiconductor layer at least down to the flow path of carriers; and an electrode forming step of filling an electrode material in the recess structure.

Thus, a semiconductor device designed to utilize an electroconductive layer formed near a hetero-junction interface of a compound semiconductor according to the present invention shows both a reduced on-resistance and a high breakdown voltage.

DETAILED DESCRIPTION OF THE PREFERRED EMBODIMENTS

Now, embodiments of semiconductor device according to the present invention will be described. More specifically, the embodiments are high electron mobility transistor (HEMT) devices. In such a HEMT device, a hetero structure is formed on a GaN substrate and an electron current is made to flow in a transverse direction, which is a direction running in parallel with the substrate surface.

First Embodiment

Figure 1:
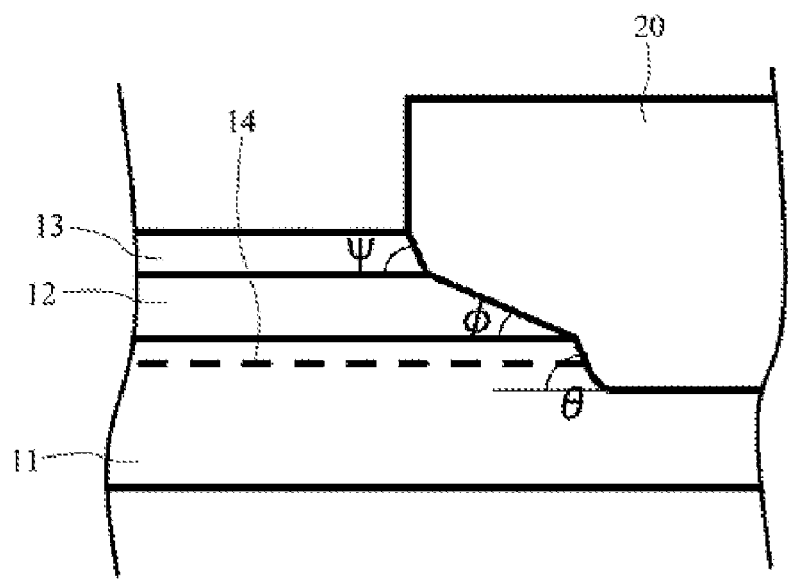
FIG. 1 is a schematic cross-sectional view of the HEMT device according to the first embodiment of the present invention taken near the drain electrode thereof.

FIG. 1 is an enlarged schematic cross-sectional view of the HEMT device according to the first embodiment taken near the drain electrode thereof. Thus, FIG. 1 is a cross-sectional view of the HEMT device taken along the direction in which an operating current flows. For the HEMT device, a channel layer 11 made of semi-insulating GaN (the first semiconductor layer), an electron supply layer 12 made of non-doped AlGaN (the second semiconductor layer) and a cap layer 13 made of n-GaN are sequentially formed on a substrate (e.g., an n-GaN: n-type GaN wafer) typically by means of a MBE (molecular beam epitaxy) method, a MOVPE (metalorganic vapor phase epitaxy) method or the like. The channel layer 11, the electron supply layer 12 and the cap layer 13 may typically have respective thicknesses of about 2 μm, about 40 nm and about 50 nm.

Both the channel layer 11 and the electron supply layer 12 operate as active layers in the HEMT device. Non-doped AlGaN for forming the electron supply layer 12 is non-doped $Al_xGa_{1-x}N$ (where x=around 0.20). Two-dimensional electron gas layer 14 that operates as channel (conductive) layer in the HEMT device is formed near and in parallel with the interface (hetero interface) of the channel layer 11 and the electron supply layer 12 at the side of the channel layer 11 so that an electron current flows between a source electrode (not shown) and a drain electrode 20. On/off of the HEMT device is controlled by a gate electrode (not shown). The drain electrode 20 is formed so as to contact the two-dimensional electron gas layer 14.

The cap layer 13 is formed by a material with different composition or with different element (a material with different component elements) from the electron supply layer 12 for the purpose of improving the reliability of the HEMT device by making it operate to control the surface charge and reduce the electrode resistance as described in Jpn. Pat. Publication No. 2001-274375, for example, or by suppressing exposure of Al, which is liable to be oxidized and hence instable, in the electron supply layer 12 (AlGaN). The cap layer 13 may alternatively be formed by semi-insulating (non-doped) GaN or AlGaN. The cap layer 13 may not necessarily be formed by a semiconductor.

Figure 5:
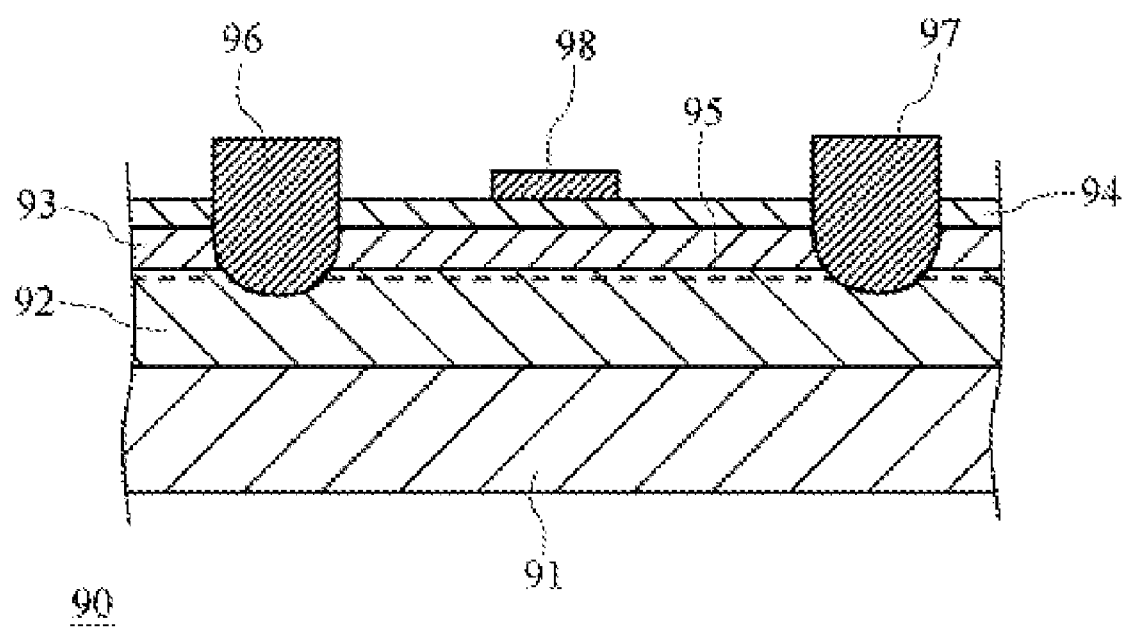
FIG. 5 is a cross-sectional view of a conventional HEMT device.

FIG. 1 is a cross-sectional view of the above-described structure and shows the layers without any shading unlike ordinary cross-sectional views. While FIG. 1 shows a cross section of the drain electrode 20 at the side of the two-dimensional electron gas layer (left side), the device has a similar structure at the opposite side (right side). The source electrode has a structure symmetric relative to the drain electrode 20 and the gate electrode has a conventional structure as shown in FIG. 5. The substrate is omitted in FIG. 1.

The drain electrode 20 runs through the cap layer 13 and the electron supply layer 12 and the bottom surface of the drain electrode 20 gets to a position lower than the two-dimensional electron gas layer 14 in the channel layer 11. Thus, the drain electrode 20 directly contacts the channel layer 11, the electron supply layer 12 and the cap layer 13. These layers spread in directions running in parallel with the hetero interface. So does the two-dimensional electron gas layer 14. The angles (acute angles) formed by the drain electrode 20 and the channel layer 11, the electron supply layer 12 and the cap layer 13 in the direction in which the hetero interface is formed (the transverse direction in FIG. 1) are defined as θ, ø and ψ respectively. θ, ø and ψ are further defined to be 0°<θ≦90°, 0°<ø<90° and 0°<ψ≦90°. Thus, with this arrangement, the drain electrode 20 is made to a tapered profile, its cross-sectional area taken along the hetero interface being greater at the side of the electron supply layer 12 than at the side of the channel layer 11. Additionally, ø<θ and ø≦ψ are defined. In other words, the angle ø is defined to be smallest of the angles and the drain electrode 20 is particularly remarkably tapered at the electron supply layer 12. Note that, in the strict sense of the words, θ is the angle formed by the tangent plane of the lateral surface of the drain electrode and the hetero interface at a position where the drain electrode 20 contacts the two-dimensional electron gas layer 14. ø is the angle (acute angle) formed by the tangent plane of the drain electrode 20 and the hetero interface at a position where the drain electrode 20 contacts the electron supply layer 12 above the position where the drain electrode 20 contacts the two-dimensional electron gas layer 14. Similarly, ψ is the angle formed by the tangent plane of the lateral surface of the drain electrode and the hetero interface at a position where the drain electrode 20 contacts the cap layer 13 above the position where the drain electrode 20 contacts the two-dimensional electron gas layer 14.

The HEMT device can be made to show a high breakdown voltage by using a drain electrode 20 arranged in the above-described manner. For instance, it is like a field plate electrode described in International Publication WO 2005/081304. The technique of alleviating the electric field concentration between the drain electrode and the gate electrode to improve the breakdown voltage by arranging a field plate electrode that is made to show an electric potential level equivalent as the source electrode or the gate electrode is known. According to literatures including the above cited one, a similar effect is achieved by means of a single gate electrode by using a field plate electrode having a tapered profile for the gate electrode. The use of a drain electrode having such a profile in place of a gate electrode is effective to achieve an objective of improving the breakdown voltage relative to the potential difference between the drain electrode and the gate electrode. Therefore, with the arrangement of FIG. 1, a similar effect is achieved by making the drain electrode 20 show a tapered profile at an end (left side: at the side of contacting the two-dimensional electron gas layer 14). More specifically, this effect is achieved by particularly tapering (decreasing the angle ø of) the drain electrode 20 at a position where the drain electrode 20 contacts the electron supply layer 12. For this purpose, it is particularly preferable to select a value defined by $0° < ø \leq 60°$ for ø.

On the other hand, the taper angle θ at the channel layer 11 is made to be greater than ø. In other words, the drain electrode 20 is tapered less at a position where the drain electrode 20 contacts the channel layer 11 than at a position where the drain electrode 20 contacts the electron supply layer 12. The device is made to show a high breakdown voltage and any substantial increase of the area of the drain electrode 20 can be suppressed to make it possible to miniaturize the device by this arrangement.

The cap layer 13 is substantially made thin over a large region when the taper angle ψ relative to the cap layer 13 is small so that the effect of controlling the surface charge, or the objective of arranging the cap layer, is made less. Therefore, the angle ψ is preferably not smaller than the angle ø.

When manufacturing a device having the above-described shape, a recess structure is formed by dry etching the cap layer 13, the electron supply layer 12 and the channel layer 11, using a photoresist mask, by means of photolithography (an etching step). Subsequently, after removing the photoresist, the recess structure is filled with an electrode material (materials forming an ohmic contact, for example, a laminate structure of titanium (Ti) and gold (Au)) by sputtering or plating (an electrode forming step). In this case, the shape of the drain electrode 20 exactly agrees with the shape of the recess structure formed by dry etching. As well known, the taper angle can be made to vary among the layers by adjusting the dry etching conditions (the gas composition, the gas pressure, the plasma generating conditions, etc.) and controlling the anisotropy. In other words, the shape of the drain electrode 20 and hence that of the recess structure as shown in FIG. 1 can be realized by controlling the dry etching conditions, the mask material and so on.

While FIG. 1 illustrates only the structure of the device at the position where the drain electrode 20 contacts the two-dimensional electron gas layer 14, the drain electrode 20 shows the same shape at all the positions where the drain electrode 20 contacts the channel layer 11, the electron supply layer 12 and the cap layer 13 when the recess structure is formed with this method. Note, however, from the viewpoint of simplifying the steps of manufacturing the device, the etching operation of forming a recess structure at the side of the drain electrode 20 and the etching operation of forming a recess structure at the side of the source electrode are preferably conducted at the same time. If such is the case, while the source electrode can easily be made to have a structure same as the drain electrode, it is also possible to make the source electrode have a structure different from the drain electrode by using different mask materials and making them show different thicknesses.

Note, however, that the drain electrode may be made to show the above-described shape only at the lateral surface of the side that faces the source electrode. Then, the area that the drain electrode occupies can advantageously be reduced to miniaturize the device by making the ø or the like close to 90° at the other side.

Figure 2:
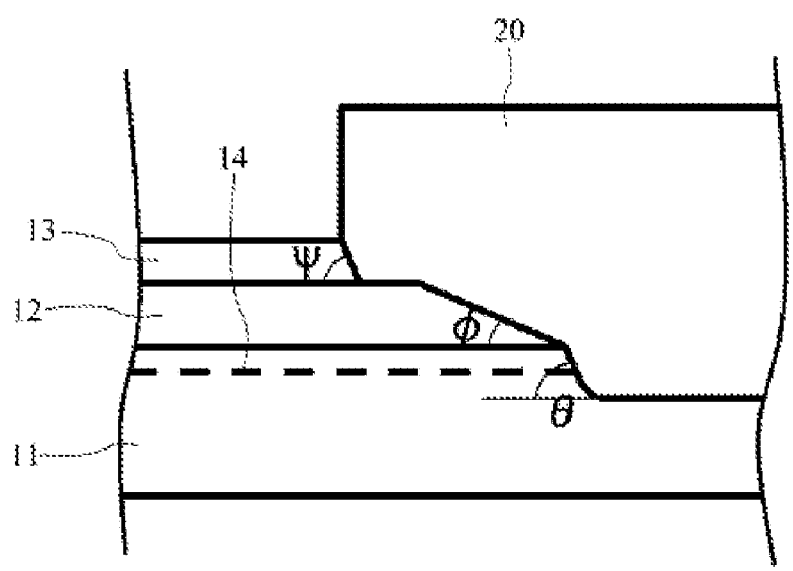
FIG. 2 is a schematic cross-sectional view of a modified example of the HEMT device according to the first embodiment of the present invention taken near the drain electrode thereof.

The profile of a top part of the shape of the recess structure, particularly at the position where the drain electrode 20 contacts the cap layer 13, may be defined appropriately. For instance, the opening of the recess structure may be made wide open at the cap layer 13 as shown in FIG. 2. Note that a step is formed at the interface of the cap layer 13 and the electron supply layer 12 so as to make the cross-sectional area of the drain electrode 20 taken along the direction of the hetero interface greater at the side of the cap layer 13 than at the side of the electron supply layer 12. With such an arrangement, top surface area of the drain electrode 20 can be made large so that wires can easily be drawn out therefrom and the resistance of the drain electrode including the wires can be reduced.

Additionally, the cap layer 13 is provided for the purpose of controlling the surface charge and so on and its influence on the operation of the HEMT device itself is small if compared with the channel layer 11 and the electron supply layer 12. Therefore, an arrangement of excluding the cap layer 13 is also possible. Alternatively, an insulating layer of semi-insulating GaN or some other material can be used for the cap layer 13 instead of n-type GaN. If such is the case, the above description of the taper angle ψ is also applicable to such a layer.

While GaN is employed for the channel layer (the first semiconductor layer) and AlGaN is employed for the electron supply layer (the second semiconductor layer) in the above instance, a semiconductor device according to the present invention provides advantages same as those described above when each of the semiconductor layers is made of a composition expressed generally as $Al_xM_yGa_{1-x-y}N$ (where $0 \leq x < 1$, $0 \leq y < 1$, $0 \leq x+y < 1$ and M contains at least In or B). A similar semiconductor can also be used for the cap layer.

Second Embodiment

Figure 3:
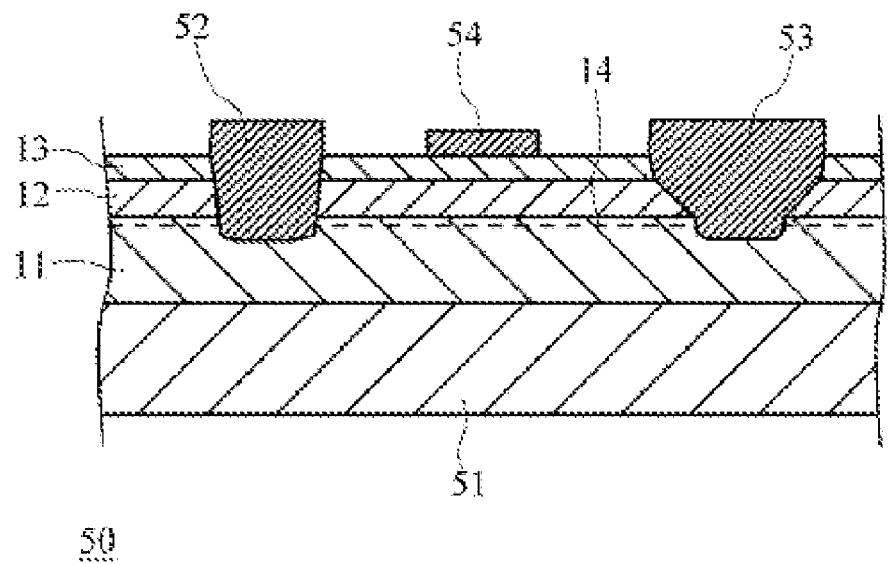
FIG. 3 is a schematic cross-sectional view of the HEMT device according to the second embodiment of the present invention.

The second embodiment is a whole HEMT device having a drain electrode of the above-described structure. FIG. 3 is a cross-sectional view of the HEMT device 50 taken along the direction in which an operating current flows. The description given above for the channel layer 11, the electron supply layer 12 and the cap layer 13 formed on the substrate 51 of the first embodiment also applies to this HEMT device 50. A two-dimensional electron gas layer 14 is also formed in this device. The two-dimensional electron gas layer 14 is formed between the source electrode 52 and the drain electrode 53 and on/off of the HEMT device 50 is controlled by the voltage applied to the gate electrode 54.

In many field effect transistors including HEMT devices, the source electrode and the drain electrode are generally made to show respective shapes that are symmetric relative to each other from the viewpoint of simplifying the manufacturing steps. To the contrary, in the HEMT device 50, the drain electrode 53 is made to show a shape similar to the drain electrode 20 of the first embodiment that is remarkably tapered at a position where the drain electrode 53 contacts the electron supply layer 12. On the other hand, the source electrode 52 is made to show a shape same as the source electrodes of conventional HEMT devices as shown in FIG. 5. More specifically, a relationship of ø'>ø is made provided for the angle ø' that is defined for the source electrode 52 like the angle ø defined for the drain electrode 20. This arrangement can be realized by separately conducting an etching process for forming a recess structure for the drain electrode 53 and an etching process for forming a recess structure for the source electrode 52 under different etching conditions. Note, however, it is possible to conduct the etching processes at the same time, using different etching masks for them.

When a drain electrode 53 having a tapered shape that makes the size of the electrode is substantially large is employed with this arrangement, a high breakdown voltage can be realized by way of electric field alleviation between the gate electrode 54 and the drain electrode 53. On the other hand, it is not so important to make the breakdown voltage between the source electrode 52 and the gate electrode 54 high, because the potential difference between them is smaller than the that between the gate electrode 54 and the drain during the operation of HEMT device 50. For this reason, the source electrode 51 is made to have a shape that is tapered only to a small extent and hence advantageous for miniaturization and integration.

Thus, the HEMT device 50 is suited for reducing the on-resistance, for raising the breakdown voltage and also for miniaturization of the device.

Third Embodiment

Figure 4:
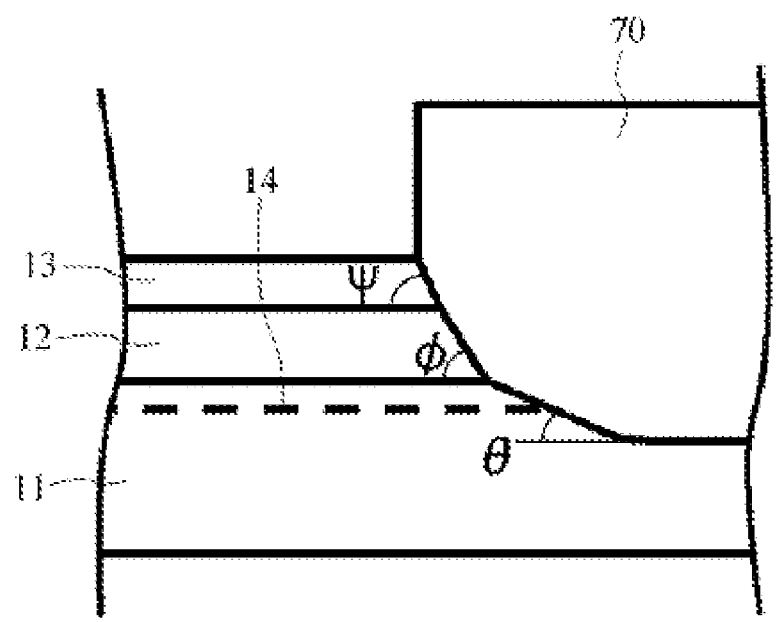
FIG. 4 is a schematic cross-sectional view of the HEMT device according to the third embodiment of the present invention taken near the drain electrode thereof.

FIG. 4 is a schematic cross-sectional view of the HEMT device of the third embodiment of the present invention taken near the drain electrode 70 thereof. In this embodiment, the angle θ formed by the tangent plane of the lateral surface of the drain electrode 70 and the hetero interface is made small by defining ψ>ø>θ. As a result, an effect similar to that of the structure described in Patent Document 1 can be achieved. More specifically, the contact resistance between the two-dimensional electron gas layer 14 and the drain electrode 70 can be reduced by increasing the contact area between them. Additionally, a field plate effect can be achieved as in the case of the first embodiment. In other words, both a reduction of on-resistance and a rise of breakdown voltage can be achieved at the same time. Note, however, that ø is preferably confined within the range of 0°<ø≦60° as in the case of the first embodiment.

On the other hand, any substantial increase of area that may otherwise occur when the drain electrode 70 is tapered can be suppressed by establishing a relationship of ψ>ø>θ. In other words, an advantageous structure for miniaturization and integration can be obtained without suppressing the above effects.

In the first embodiment, the drain electrode 70 may be made to show the shape as shown in FIG. 5 only at the side facing the source electrode. Additionally, the recess structure may be made to have a step at the cap layer 13 to broaden its diameter there. Furthermore, in HEMT device of the first embodiment, only the drain electrode may be made to have such a structure so that the source electrode may have a slightly tapered shape like its counterpart of the HEMT device of the second embodiment. This arrangement is advantageous for miniaturization and integration.

While ø is preferably confined within the range of 0°<ø≦60° for both the first embodiment and the third embodiment, these embodiment differs from each other in that the first embodiment meets the requirement of ø<θ, whereas the third embodiment meets the requirement of ø>θ. Either of the requirements to be met may be chosen depending on how the two-dimensional electron gas layer 14 is formed in the channel layer 11.

GaN is employed for the channel layer (the first semiconductor layer) and AlGaN is employed for the electron supply layer (the second semiconductor layer) in all the HEMT devices of the above-described embodiments. However, the present invention can apparently be applied to any semiconductor device that employs two-dimensional electron gas and establishes a contact (electric connection) at the lateral surface of a recess structure to provide similar advantages. For example, the present invention is equally applicable to an HEMT device that employs GaAs for the channel layer and AlGaAs for the electron supply layer. The present invention is also applicable to an HEMT device that employs two-dimensional hole gas (other two-dimensional carrier gas) instead of two-dimensional electron gas.

Furthermore, the present invention is apparently applicable to any semiconductor device other than an HEMT device that includes an electrode in a recess structure formed in semiconductor layers. For example, the present invention is equally applicable to a MESFET (metal semiconductor field effect transistor) or the like. While carriers in a conductive layer of a semiconductor device are electrons in the above description, similar advantages can be obtained when the carriers are holes.

What is claimed is:
1. A semiconductor device comprising:
a hetero structure formed by laying a first semiconductor layer within which a flow path of carriers is formed and a second semiconductor layer made of a material different from that of the first semiconductor layer and laid on the first semiconductor layer; and
an electrode penetrating through the second semiconductor layer, held in contact with the flow path of carriers and tapered so as to make the cross-sectional area parallel to the hetero interface of the hetero structure larger at the side of the second semiconductor layer than at the side of the first semiconductor layer,
the device showing relationships of 0°<ø≦60° and ø≠ø,
where θ is the acute angle formed by the tangent plane of the lateral surface of the electrode and the hetero interface at a position where the electrode contacts the flow path of charge carriers and ø is the acute angle formed by the tangent plane of the lateral surface of the electrode and the hetero interface at a position where the electrode contacts the second semiconductor layer above the position where the electrode contacts the flow path of charge carriers on respective cross sections taken along the flow direction of charge carriers.

2. The semiconductor device according to claim 1, wherein a cap layer made of a material with different composition or different element from the second semiconductor layer is formed on the second semiconductor layer and the electrode penetrates through the cap layer, the device showing a relationship of $ø≦ψ$, where $ψ$ is the acute angle formed by the tangent plane of the lateral surface of the electrode and the hetero interface at a position where the electrode contacts the cap layer above the position where the electrode contacts the flow path of carriers on a cross section taken along the flow direction of carriers.

3. The semiconductor device according to claim 2, wherein a step is formed at the lateral surface of the electrode where the electrode contacts the cap layer and the second semiconductor layer so as to make the cross-sectional area of the electrode taken along the hetero interface greater at the side of the cap layer than at the side of the second semiconductor layer as viewed from the interface of the cap layer and the second semiconductor layer.

4. The semiconductor device according to claim 1, wherein the first and second semiconductor layers respectively have compositions expressed by chemical formulas of $Al_xM_yGa_{1-x-y}N$ (where $0≦x<1$, $0≦y<1$, $0≦x+y<1$ and M contains at least In or B).

5. The semiconductor device according to claim 1, wherein the flow path of carriers is formed two-dimensionally by carrier gas generated in the first semiconductor layer.

6. The semiconductor device according to claim 1, comprising two electrodes so as to make carriers flow between the two electrodes and a gate electrode arranged on the flow path of carriers.

7. The semiconductor device according to claim 1, further comprising another electrode that penetrates through the second semiconductor layer, contacts the flow path of carriers, and the flow path is made between the another electrode and the electrode, and a gate electrode formed on the flow path of carriers, the device showing a relationship of $ø'>ø$, where $ø'$ is the angle formed by the tangent plane of the lateral surface of the another electrode and the hetero interface at a position where the another electrode contacts the second semiconductor layer.

8. The semiconductor device according to claim 1, showing a relationship of $ø<θ$.

9. The semiconductor device according to claim 1, showing a relationship of $ø>θ$.

10. A method of manufacturing a semiconductor device as defined in claim 1, comprising:

an etching step of forming a recess structure corresponding to the shape of the electrode by locally dry etching the second semiconductor layer and also the first semiconductor layer at least down to the flow path of carriers; and an electrode forming step of filling an electrode material in the recess structure.

* * * * *